(12) United States Patent
Williams et al.

(10) Patent No.: US 9,838,986 B2
(45) Date of Patent: Dec. 5, 2017

(54) CALIBRATION OF HIGH FREQUENCY SIGNAL MEASUREMENT SYSTEMS

(71) Applicant: MESURO LIMITED, Pencoed, Bridgend South Wales (GB)

(72) Inventors: Tudor Vyvyan Williams, Rhondda Cynon Taff (GB); Paul Juan Tasker, Aberthin (GB)

( * ) Notice: Subject to any disclaimer, the term of this patent is extended or adjusted under 35 U.S.C. 154(b) by 0 days.

(21) Appl. No.: 14/438,809

(22) PCT Filed: Oct. 24, 2013

(86) PCT No.: PCT/GB2013/052782
§ 371 (c)(1),
(2) Date: Apr. 27, 2015

(87) PCT Pub. No.: WO2014/064453
PCT Pub. Date: May 1, 2014

(65) Prior Publication Data
US 2015/0358929 A1  Dec. 10, 2015

(30) Foreign Application Priority Data
Oct. 26, 2012 (GB) .................... 1219310.8

(51) Int. Cl.
| | |
|---|---|
| H04W 56/00 | (2009.01) |
| H04B 17/14 | (2015.01) |
| H04L 7/04 | (2006.01) |
| H04B 17/391 | (2015.01) |
| G01R 35/00 | (2006.01) |

(52) U.S. Cl.
CPC ........ *H04W 56/001* (2013.01); *G01R 35/005* (2013.01); *H04B 17/14* (2015.01); *H04B 17/391* (2015.01); *H04L 7/041* (2013.01)

(58) Field of Classification Search
CPC ...... G01R 27/28; G01R 25/00; G01R 35/005; Y02B 60/50; H04B 17/21
USPC .................................................. 375/224, 226
See application file for complete search history.

(56) References Cited

U.S. PATENT DOCUMENTS

| | | | |
|---|---|---|---|
| 7,592,818 B2 * | 9/2009 | Mori ...................... | G01R 27/28 324/638 |
| 2003/0102907 A1 * | 6/2003 | Tasker ................... | G01R 27/28 330/2 |

(Continued)

*Primary Examiner* — Freshteh N Aghdam (57) ABSTRACT

A method of calibrating a high frequency signal measurement system is described. The measurement system is in the form of a network analyzer (6) and has first and second phase-locked signal sources (SS1 & SS2) and at least two measurement receivers (18a, 18b). A phase meter (26) is provided. A reference signal (F0) is outputted at a first frequency from the first signal source (SS1). The second signal source (SS2) steps through a multiplicity of different test frequencies (nF0), being phase-locked with the reference signal (F0), which are applied in turn to a part of the measurement system. Measurements are taken, via the two measurement receivers (18a, 18b), of characteristics of the resulting signal at a measurement plane. The absolute phase of the signal at the measurement plane is also measured with the phase meter (26). Calibration data is generated which relates the characteristics of the signals as measured by the measurement system (6) and the absolute phase as measured with the phase meter (26).

10 Claims, 7 Drawing Sheets

(56) References Cited

U.S. PATENT DOCUMENTS

| | | | | |
|---|---|---|---|---|
| 2007/0236230 | A1* | 10/2007 | Tanbakuchi | G01R 27/28 324/650 |
| 2009/0184721 | A1* | 7/2009 | Albert-Lebrun | G01R 35/005 324/601 |
| 2014/0368216 | A1* | 12/2014 | Pailloncy | G01R 25/00 324/602 |

* cited by examiner

$$B_{PM} = \varepsilon_{PM} \cdot a_1$$

$$a_1 = |\varepsilon_{10}| a_0$$

$$|\varepsilon_{10}| = \left| b_{PM} / \varepsilon_{PM} a_0 \right|$$

$$b_{Phase} = \varepsilon_{Phase} \cdot a_1$$

$$a_1 = |\varepsilon_{10}| < \varepsilon_{10} \cdot a_0$$

$$< \varepsilon_{10} = \theta_n = < \left( b_{Phase} / |\varepsilon_{10}| \epsilon_{Phase} a_0 \right)$$

CALIBRATION OF HIGH FREQUENCY SIGNAL MEASUREMENT SYSTEMS

BACKGROUND OF THE INVENTION

The present invention concerns calibration of high frequency signal measurement systems. More particularly, but not exclusively, this invention concerns method of calibrating a high frequency signal measurement system and an apparatus for performing such a method. The invention also concerns a method of measuring the response of an electronic device to a high frequency input signal, computer software for controlling a calibration process, and a calibrated network analyser.

The invention relates particularly to the field of RF microwave frequency engineering applications, particularly in applications allowing measurement of absolute phase when analysing, and characterizing, the large signal behaviour of a high frequency device. Such high frequency devices may for example be in the form of high power amplifiers for use in a mobile telephone network. The field of invention also extends to tracking the relative phase between spectral components at different frequencies of signals, particularly RF signals. This includes, for example, tracking between input signals and down-converted output signals of frequency transforming devices such as mixers or multipliers. Such devices are commonly used in receivers and transmitters. To make such measurements a calibrated high frequency measurement system is typically required.

The provision of a calibrated high frequency measurement system that is able to extract not only absolute signal magnitude information, but also absolute signal phase information, from measurements of signals at a measurement plane, may assist greatly with the analysing, and characterising, of the large signal behaviour of a high frequency device, commonly referred to in the art as a device under test (DUT). Such analysis and characterisation is for example useful when seeking to improve or optimize the performance of devices or circuits for use in high power, high frequency amplifiers, such as an amplifier for use in a mobile telephone network.

It will be appreciated that the term "absolute phase" is used herein to refer to the phase of a signal relative to a fixed and known (but perhaps notional) point in time, so that the phase of various signals at different frequencies may be established relative to such a fixed point in time.

Analysis of the behaviour of a DUT is typically carried out with the assistance of a high frequency measurement apparatus, such as a vector network analyser (VNA). A VNA is typically capable of measuring the small signal (linear) performance of a DUT. However, to enable such a measurement apparatus to make non-linear (large signal) measurements, additional calibration steps are required, to ascertain absolute magnitude (power) and phase measurements of signals at the DUT. A VNA, once so calibrated and set-up to make non-linear measurements, is typically termed a non-linear vector network analyser (NVNA). Ascertaining the absolute magnitude of signals from measurements made by the VNA can be achieved by calibrating the VNA with reference to measurements directly made with a power meter. Ascertaining the absolute phase of signals from measurements made by the VNA can be achieved with the use of a phase reference standard, which may be defined by a pre-characterised high frequency signal.

There are proposals in the prior art relating to the provision and use of phase reference standards, such as the paper entitled "Time-Domain Calibrated Measurements of Wideband Multisines Using a Large-Signal Network Analyzer" by Mohammed El Yaagoubi, Guillaume Neveux, Denis Barataud, Tibault Reveyrand, Jean-Michel Nebus, Frans Verbeyst, Francis Gizard, and Jérôme Puech (IEEE Transactions on Microwave Theory and Techniques Vol. 56, No. 5, May 2008, pp 1180 to 1192), which paper proposes a pulse/comb generator made using step recovery diodes (SRD), yielding a multitude of harmonics with a known phase relationship.

Figure 1:
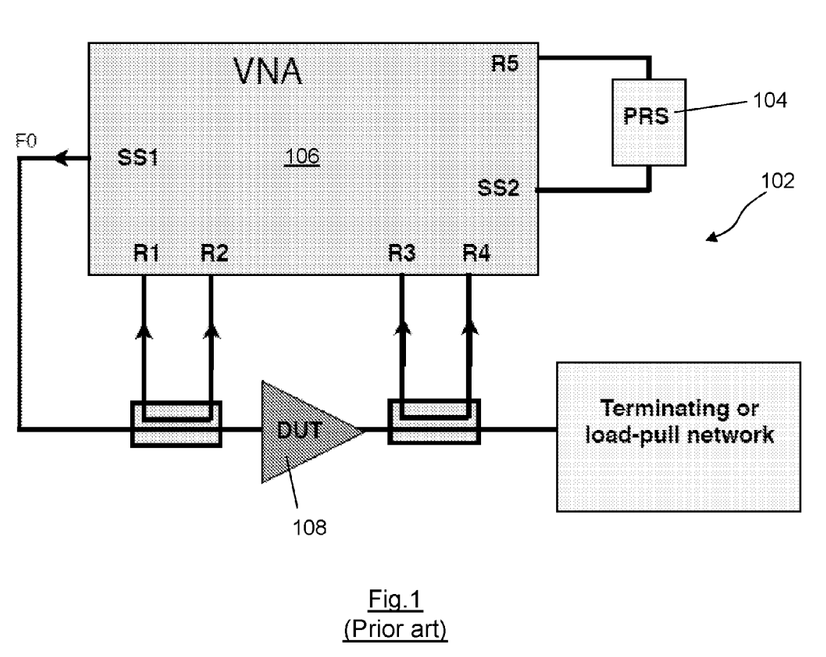
FIG. 1 shows an example of a measurement system architecture including a phase reference standard according to the prior art.

An exemplary set-up of a measurement system 102 utilising a phase reference standard system 104 is illustrated in FIG. 1 of the accompanying drawings. The system 104 that generates the phase reference standard (comprising signal components at different predefined and pre-characterised frequencies and absolute phases relative to a trigger signal) is connected to the VNA 106 during any method of measuring the behaviour of a DUT 108. The phase reference standard system 104 uses at least one measurement channel (R5) of the VNA 106 thus reducing the number of measurement channels (R1-R4) available for measuring other signals. Often two measurement channels of the VNA are required to allow the phase reference standard to be properly and fully integrated into the measurement system. A signal generator source (SS2) of the VNA 106 is also required for use solely for the purposes of providing the phase reference standard. It is therefore desirable to provide a method of calibrating a high frequency measurement system, such as a VNA, without requiring the need to have a phase reference standard system connected to the high frequency measurement system during characterisation/measurement of the behaviour of a DUT. Systems for generating phase reference standards can suffer from a lack of reliability/quality (high noise relative to signal levels, for example), particularly at high frequencies, and can therefore be limited in the bandwidth of operation.

The present invention seeks to mitigate one or more of the above-mentioned problems. Alternatively or additionally, the present invention seeks to provide an improved method of calibrating a high frequency signal measurement system and/or an improved calibration apparatus for a high frequency signal measurement system.

SUMMARY OF THE INVENTION

The present invention provides a method of calibrating a high frequency signal measurement system, for example a network analyser, wherein the measurement system has at least two phase-locked signal sources comprising a first signal source and a second signal source, and comprises at least two measurement receivers. The method comprises the following steps: providing a phase meter, outputting a reference signal at a first frequency from the first signal source, and using the second signal source to step through a multiplicity of different test frequencies, being phase-locked with the reference signal. For each different test frequency, the method includes applying a signal, at the test frequency, to a part of the measurement system, measuring, via the two measurement receivers, characteristics of the resulting signal at a measurement plane, measuring, with the phase meter, the absolute phase of the signal at the measurement plane, and generating calibration data relating the characteristics of the signal as measured at the measurement plane by the measurement system and the absolute phase as measured with the phase meter.

The phase-locked signal sources are advantageously of a type that reliably generate signals with stable and repeatable phase and magnitude characteristics (for example enabling the measurement system to be used as a time coherent system), such that once the measurement system is successfully calibrated in relation to phase measurements, there is no need for a phase reference standard to be provided or applied during subsequent use of the measurement system to characterise the behaviour of a device-under-test. Given that the present invention does not require the use of a phase reference standard, the calibration method of the invention is not reliant on further development of such standards if and when, for example, higher frequency VNAs become available. Coping with such higher frequency VNA capability should simply be a matter of scaling the method of the present invention as required. The method of calibration is thus readily scalable and can moreover be adapted to provide as fine a calibration (resolution of frequency) as is desired and/or extended over whatever range of frequencies (bandwidth) as is desired, within of course the limits of the capabilities of the particular measurement system concerned. Lastly, as each test signal may be generated successively there is no limit on power levels and consequent signal to noise level issues, as there often is in relation to phase reference standards in which all signals for the standard are generated simultaneously with a consequent limitation on the power of each.

The measurement plane may be defined by a particular arrangement and/or configuration of the measurement system. There may be a step of arranging the measurement system so as to define a signal measurement plane. Such a step may include connecting the measurement system to a set of one or more external circuit components so as to define a signal measurement plane. The calibration method may however be limited to calibrating only for components that are internal to, or otherwise integrated with, the measurement system, which may for example be the case if the method were used to calibrate at one of the measurement receivers of the measurement system. The step of applying a signal at the test frequency to a part of the measurement system may include applying the signal to, or via, such a set of one or more external circuit components. The set of one or more external circuit components may be in the form of a test set. The set of one or more external circuit components may be pre-calibrated. The set of one or more external circuit components may simply be in the form of one or more cables and associated connector(s).

The characteristics of the signal at the measurement plane as measured via the two measurement receivers may include signal phase and signal magnitude information in the time-domain. The signal at the measurement plane as measured via the two measurement receivers may be considered as comprising a travelling wave. A directional coupler may be provided to facilitate measurement of the signal characteristics of such a travelling wave.

As mentioned above, the high frequency signal measurement system may for example be a network analyser. The invention has particular application in relation to a network analyser in the form of a vector network analyser (VNA). The VNA may be in the form of a Large Signal Network Analyser (LSNA). The VNA may be a non-linear vector network analyser (NVNA).

The method may include ascertaining, in respect of each different test frequency, the absolute magnitude of the signal at the measurement plane. This may be done by measuring the magnitude with the use of a power meter. Calibration data relating the characteristics of the signal as measured at the measurement plane by the measurement system and the absolute magnitude as ascertained (for example as measured with the power meter) may then be generated. It will be appreciated that the same set of calibration data may relate (i) the characteristics of the signal as measured at the measurement plane by the measurement system and (ii) both the absolute phase and magnitude measurements as ascertained (for example with the use of the phase meter and the power meter, respectively).

The calibration data so produced may be in the form of a fully corrected error model, for example in the form of a fully corrected error model for each test frequency. The error model may be an 8-term or a 12-term model, or possibly a higher order model. The error model may be for a one-port network. The error model may be for a multi-port network.

The calibration with respect to measured signal magnitude may be performed separately from the calibration with respect to measured signal phase. Absolute phase and absolute magnitude measurements could be measured simultaneously, at each given test frequency, but it is preferred to make such measurements separately. The measurements made of absolute phase at the multiplicity of different test frequencies may be taken either all before or all after the measurements made of absolute magnitude at the multiplicity of different test frequencies. At least two calibration runs may then be required, one run to take magnitude measurements and the other run to take phase measurements.

The step of measuring, with the phase meter, the absolute phase of the signal at the measurement plane may comprise measuring the absolute phase relative to a trigger signal based on the reference signal. The reference signal, or a signal derived therefrom, may be used as a trigger.

The step of measuring, with the phase meter, the absolute phase of the signal at the measurement plane may comprise measuring the phase of a secondary reference signal for the purposes of correcting jitter.

The phase meter may be in the form of an oscilloscope. It will be appreciated that the phase meter can be viewed as equipment from which absolute phase information can be ascertained during performance of the method. It is therefore within the scope of the present invention to have the function of the phase meter performed by other suitable phase equipment from which such absolute phase information can be ascertained during calibration. The phase meter could for example be replaced by other such phase equipment. It may for example be possible to use a phase reference standard when performing the calibration method. Unlike prior art systems which require the phase reference standard to remain attached to the measurement system in order to correct for absolute phase when using the measurement system to analyse the behaviour of a device under test (DUT), the use in the present invention of the phase-locked signal sources of the measurement system and the generated calibration data to ascertain the absolute phase information at the measurement plane, allows any phase reference standard equipment used in the calibration steps of the present invention to be removed.

The step of using the second signal source to step through a multiplicity of different test frequencies may include stepping through over 5 frequencies, and preferably through over more than 10 frequencies. Over 50, or in some embodiments, over 100 different frequencies may be stepped through. The step from one frequency to the next is preferably a substantially constant frequency difference. The multiplicity of frequencies separated by such a substantially constant frequency difference may be considered as defining a frequency comb (or a frequency grid). The multiplicity of frequencies may include frequencies below 500 MHz, and in some embodiments may include frequencies at or below 100 MHz. The multiplicity of frequencies may include frequencies above 35 GHz and in some embodiments may include frequencies at or above 50 GHz. The average (mode average) separation between one test frequency and the next may be between 10 MHz and 1 GHz. Optionally, a signal having a frequency higher than 100 MHz may be deemed as "high frequency" within the context of certain embodiments of the present invention.

At least two phase-locked signal sources are conveniently provided as part of the network analyser. The two phase-locked signal sources may be in the form of (possibly independent) direct digital synthesis (DDS) based signal generators. Each single source may be arranged to generate signals having a fundamental frequency of greater than 20 GHz.

The measurement system once calibrated by the method of the invention may be used to measure characteristics of signals at a device under test (DUT) at different frequencies (for example at a fundamental and higher frequencies). By use of the calibration data, and the measured characteristics of the signals at the DUT, calibrated magnitude and phase information of the signals at the DUT may be ascertained, for example enabling transformation of such measured signals from the frequency domain to the time domain. According to a second aspect of the invention there is provided a method of measuring the response of an electronic device to a high frequency input signal using a calibrated measurement system according to or resulting from any aspect of the present invention. Such a method may comprise the steps of providing an electronic device, providing a measurement system, for example one calibrated by the above-described method, applying at one or more ports of the device one or more high frequency signals including a first signal component at a first frequency and phase and a second component at a second frequency and phase, measuring with the measurement system, at a plurality of different frequencies, signals from the one or more ports of the device, and ascertaining at least one of (a) absolute phase information from the signals so measured and (b) a time domain representation relating to the signals so measured. Such (a) absolute phase information and/or (b) time domain representation(s) is/are advantageously generated by means of an error model based on the calibration data provided by means of the present invention. The first and second signal components are preferably generated by phase-locked signal sources that form an integral part of the measurement system. The first and second signal components have different frequencies and will typically, but not necessarily, have different phases. The measurement system preferably comprises a network analyser. The measurement system preferably comprises at least two phase-locked signal sources.

The measurement system will typically comprise a plurality of measurement receivers, and preferably at least four measurement receivers. The step of measuring the signals from the device under test may include using at least four measurement receivers simultaneously to measure, at the plurality of different frequencies, signals from both of first and second ports of the device. Because a measurement system calibrated according to, or resulting from, the present invention typically does not need to be used with a phase reference standard when measuring the behaviour of a DUT, more receiver channels of the measurement system may be made available for use than with equivalent systems requiring a phase reference standard. The step of measuring the signals from the device under test may include using eight measurement receivers simultaneously to measure, at the plurality of different frequencies, signals from all of four ports of the device.

The device may be connected to the measurement system via a set of one or more external circuit components. The set of one or more external circuit components may be additional to, or different from, any external circuit components used when performing the calibration of the measurement system. There may in such cases be a need for a further calibration step to account for changes introduced by the set of one or more external circuit components. The method may for example further include performing a local calibration to correct for differences in absolute phase and magnitude measurements caused by such additional or different external circuit components.

The method of measuring the response of an electronic device to a high frequency input signal is advantageously repeated and performed in respect of a multiplicity of different conditions applied to the device. The method may for example be repeated and performed in respect of a multiplicity of different input signals applied to the device. The different input signals applied to the device may be at different frequencies and/or under different load conditions. The method may for example be performed to simulate different loads on the device. The method may be performed to simulate different impedances applied to the device. A load or impedance may be simulated by means of a load pull circuit attached to the device. The different input signals may be applied to the device at different fundamental frequencies.

The method of the invention is of particular application when the device (the DUT) is a non-linear device, especially where the device is to be used in an application where the operating range of the device is such that non-linear behaviour is significant. As such, the method is preferably performed to measure the non-linear behaviour of the electronic device (the DUT). The non-linear device (the DUT) may be non-linear in the sense that the relationship between the output voltage and the input voltage is not linear. The non-linear device (the DUT) may for example be a diode, a mixer, an oscillator or a frequency multiplier such as a doubler, or an amplifying device such as a transistor. The device may be a high power device. The device may be a high power amplifier. The device may be a high power transistor. The device may for example be a device suitable for use as a high power amplifying device in a mobile telecommunications base station. In such cases, the method advantageously includes a step of applying a high power signal to the device (the DUT). Such high powers may, depending on the device concerned, be greater than 1 W. In some case powers of 5 W may be used and in some cases the power may be greater than 10 W.

The measurement system advantageously is able to measure and characterise a waveform substantially fully across the time domain. The measurement system is preferably able to measure accurately waveforms having fundamental frequencies over a frequency range between 500 MHz and at least 70 GHz. Of course, the measurement system may also be able to measure signals having frequencies outside this range. The measurement system is preferably able to measure high voltage waveforms having fundamental frequencies above 500 MHz.

The method may include a step of applying a waveform to the device, the waveform having a plurality of single frequency harmonic components. The waveform may, for example, include a component having a fundamental frequency at a first frequency and a component at a harmonic frequency. More complicated waveforms, including components at other frequencies, may be applied. The method may include a step in which signals are simultaneously applied at more than one port of the device under test. As mentioned above, the device under test may have more than two ports. In such a case, the method of measuring the response of the device may include making measurements at more than two ports of the device, The measurement system once calibrated may be used in other applications requiring measurements of phase to be made. For example, the calibrated measurement system may be used to track the relative phase between respective signals. For example, the calibrated measurement system may be used to track the relative phase between a high frequency input signal and a down-converted output signal of a frequency transforming device, such as a mixer or multiplier. Such devices are commonly used in receivers and transmitters.

According to a third aspect of the invention there is also provided an apparatus for calibrating a high frequency signal measurement system, advantageously an apparatus being suitable for performing the calibration method of the invention described and claimed herein. The high frequency signal measurement system to be calibrated may be in the form of a network analyser, for example one comprising at least two phase-locked signal sources comprising a first signal source and a second signal source, and at least two measurement receivers. The calibration apparatus may comprise a phase meter, separate from the network analyser, and a control system. The control system may be in the form of a suitably programmed computer. The control system may comprise one or more control units, possibly simply in the form of one or more software-implemented modules. The calibration apparatus may comprise electronic memory for storing calibration data. The control system is preferably arranged (for example programmed) to cause the second signal source to step through a multiplicity of different test frequencies, preferably being phase-locked with a reference signal generated by the first signal source. The control system is preferably arranged (for example programmed) to cause the network analyser to take measurements, via its measurement receivers, at each such test frequency of characteristics of a resulting signal. The control system is preferably arranged (for example programmed) to cause the phase meter to take a measurement of the absolute phase of the resulting signal. The control system is preferably arranged (for example programmed) to generate calibration data, generated in dependence on the measurements made by the measurement system and the absolute phase measurements made by the phase meter. Such calibration data is preferably stored in the electronic memory. The apparatus may also include a data file comprising such calibration data. Such a data file may be considered as an output of the apparatus and/or the method of the invention. The data file may be an electronic data file. The data file may be a computer readable data file, for example stored on computer-readable electronic media. The calibration data may be in the form of a fully characterised error-model. The error-model may be in the form of an 8-term error model.

According to a fourth aspect of the invention there is also provided a computer software product (for example stored on computer-readable media) for implementing the calibration method and/or apparatus of the present invention. Such a computer software product may for example be configured to be suitable for loading onto a control system associated with a measurement system (for example a vector network analyser) for controlling the calibration process. The computer software product may comprise one or more modules for perform different functions. The one or more modules may be arranged, in use, to cause a signal source to step through a multiplicity of different test frequencies. The one or more modules may be arranged, in use, to cause the network analyser to take measurements, via its measurement receivers, at each of a multiplicity of test frequencies, of characteristics of a signal. The one or more modules may be arranged, in use, to cause a phase meter to take a measurement of the absolute phase of a signal. The one or more modules may be arranged, in use, to generate calibration data in dependence on the characteristics of the signal as measured by the measurement system and the absolute phase as measured with the phase meter at each of a multiplicity of different frequencies. The one or more modules may be arranged, in use, to store such data in an electronic memory store.

The present invention also provides a computer programmed with such a computer software product. The computer may be a computing device that forms an integral part of the measurement system. The computer may in some embodiments be provided separately from the network analyser with which it is paired. The measurements made by the measurement system under the control of the computer are advantageously recorded in the memory of the computer.

According to a fifth aspect of the invention there is also provided a measurement system, for example a network analyser (preferably a VNA), supplied with a computer data product providing calibration data produced in accordance with the present invention that calibrates the measurement system. The calibration data may be provided in the form of the data file of the invention as described and claimed herein.

It will of course be appreciated that features described in relation to one aspect of the present invention may be incorporated into other aspects of the present invention. For example, the method of the invention may incorporate any of the features described with reference to the apparatus of the invention and vice versa.

DESCRIPTION OF THE DRAWINGS

Embodiments of the present invention will now be described by way of example only with reference to the accompanying schematic drawings of which.

DETAILED DESCRIPTION

Figure 2:
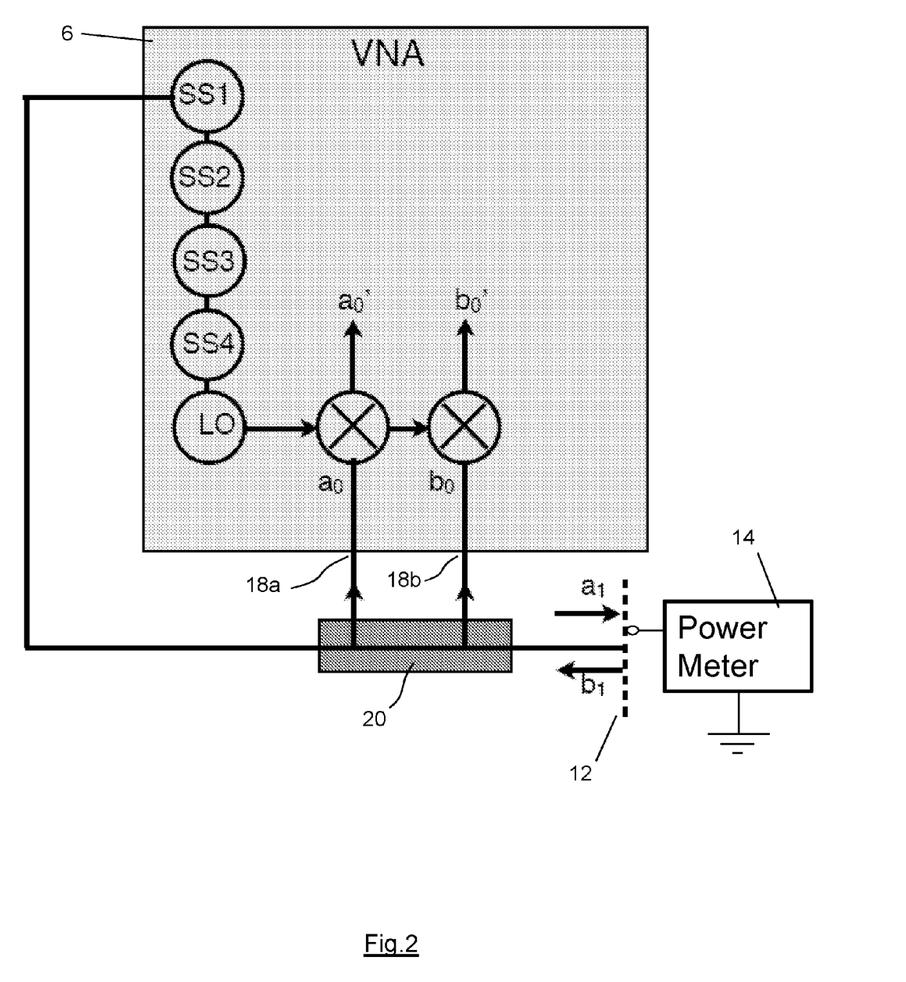
FIG. 2 shows a VNA whilst a calibration step is performed by means of a power measurement at a measurement plane using a power meter, according to a first embodiment of the present invention.

With reference to FIG. 2, a first embodiment of the present invention relates to a method of calibrating and correcting for absolute phase in relation to a time coherent VNA (vector network analyser) 6, for example a ZVA-67 available from Rohde & Schwarz GmbH & Co KG. The VNA 6 is of a type that employs Direct Digital Synthesis (DDS) based signal generators both for the internal high frequency signal sources (sources SS1 to SS4) and Local Oscillator (LO) generators. Such DDS sources due to their nature have been shown to maintain phase coherent signals between multiple generators at frequencies up to at least 65 GHz. Investigations have shown that such a VNA 6 can be employed as a time coherent system. If such a VNA 6 is used in conjunction with the calibration and correction method described below with reference to this embodiment it is possible to remove the need for the use of phase reference standard apparatus both during calibration and measurement.

Figure 3:
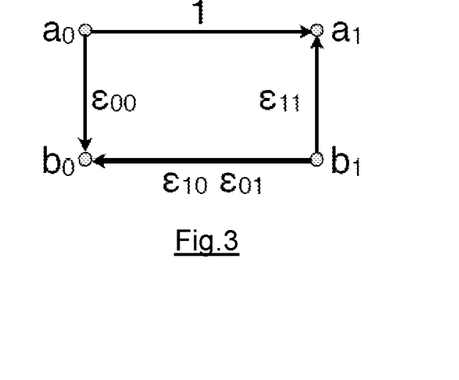
FIG. 3 shows the small signal error model for a one-port network.

The theory behind the method employed will now be described with reference to FIGS. 3 to 8. The one-port error model employed by a VNA to transform measured parameters from the receiver plane to the measurement plane 12 (i.e. from $\{a0, b0\}$ to $\{a1, b1\}$) is shown in FIG. 3. The terms of such an error model need to be ascertained at each frequency of interest to enable the VNA to produce an accurate measure of both the absolute magnitude and the absolute phase at each such frequency. Note that in the analysis below, for simplicity, the derivation is shown for a 1-port system, but this can easily be extended to allow for 2- or even multi-port measurements.

It will be noted that in FIG. 3 there is an absence of any scaling terms for either magnitude or phase, and instead the error model is normalised so that the ratio a1/ao is set to unity. The ratio b1/b0 is therefore set to the composite parameter, $\epsilon 10 \epsilon 01$.

Figure 4:
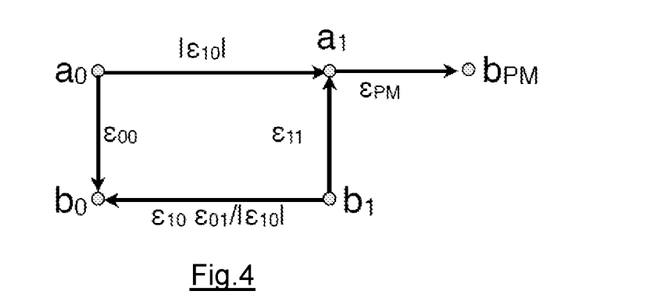
FIG. 4 shows the error model using in relation to the calibration step shown in FIG. 3.
Figure 5:
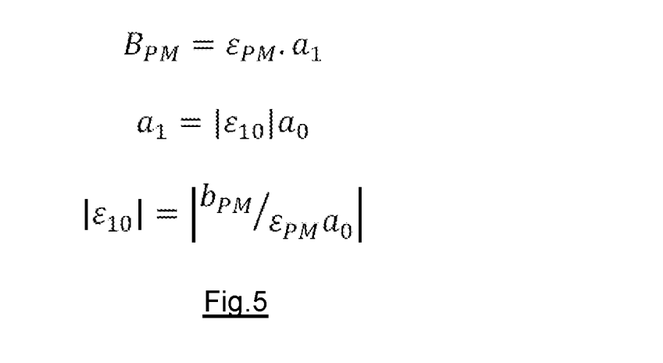
FIG. 5 is a mathematical derivation using the error model of FIG. 4.

There needs to be a step of determining the magnitude scaling error term $|\epsilon 10|$. This can be achieved through connection of a power meter 14 to the measurement plane 12, as shown in FIG. 2. Comparison of the power measured using the receivers 18a, 18b (via directional coupler 20) of the VNA 6 relative to the power measured by the power meter 14 can then be used to calculate the magnitude of $\epsilon_{10}$. The error model for this power meter measurement is shown in FIG. 4, and the derivation of $|\epsilon_{10}|$ is set out in FIG. 5. The consequent error model for the system is shown in FIG. 6.

Figure 6:
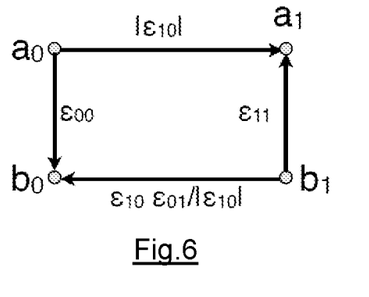
FIG. 6 shows an error model including power scaling.

Adding the absolute phase information to the error model shown in FIG. 6 allows the model to be used for the measurement of absolute waveforms. This can be achieved with the use of the first embodiment as a result of the particular VNA 6 being one that includes a time coherent signal generation system, resulting in a static phase relationship between a0, b0, a0' and b0', namely: b0'/a0'=b0/a0.

Figure 7:
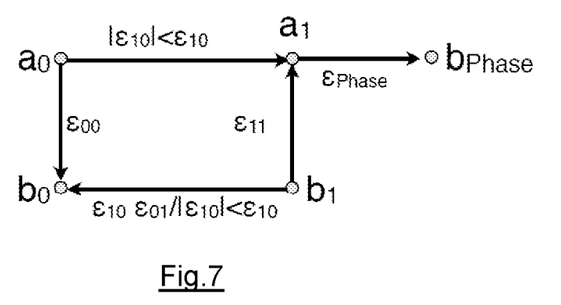
FIG. 7 shows an error model for a relative phase measurement.
Figure 8:
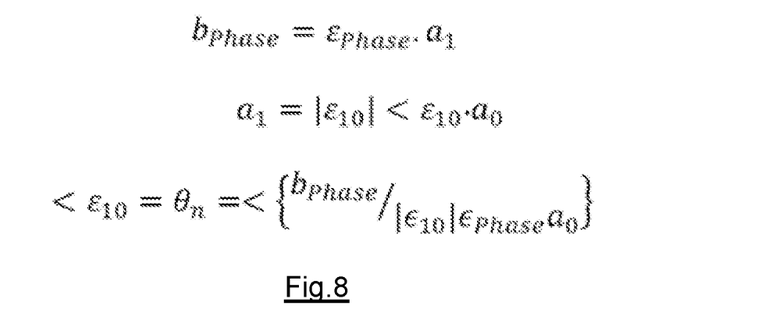
FIG. 8 is a mathematical derivation using the error model of FIG. 7.

Measuring absolute phase information at the measurement plane with a phase meter, such as an oscilloscope, allows completion of the full error model and thus facilitates subsequent measurement by the VNA of fully corrected waveforms. The error model for the relative phase measurement is shown in FIG. 7. The derivation of the relative time correction term $\theta_n$ (phase of $\epsilon_{10}$ at frequency nF0) is shown in FIG. 8.

Figure 9:
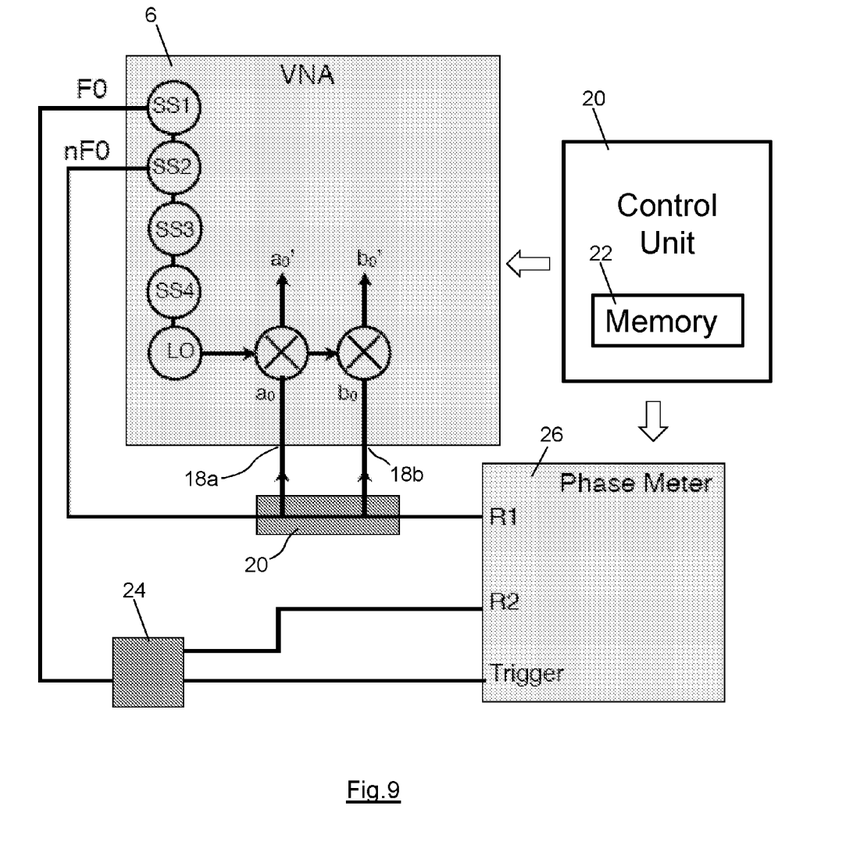
FIG. 9 shows a VNA whilst a calibration step is performed by means of a phase measurement at a measurement plane using a phase meter, according to the first embodiment of the present invention.

Thus, in accordance with the first embodiment, the setup shown in FIG. 9 can be used to make the phase measurements required to calibrate the VNA to enable it extract absolute phase information during subsequent use, without the need to connect the VNA to a phase reference standard. As shown in FIG. 9, the VNA 6 is operated under the control of a control unit 20 (typically a suitably programmed PC) with a memory 22. Absolute phase is measured by means of a phase meter 26 (in the form of an oscilloscope) which has two measurement inputs R1 and R2 and a trigger input. One (SS1) of the four phase locked sources (SS1 to SS4) is set to the base frequency F0. This signal is fed via a signal splitter 24 so that half of the signal is directed to receiver R2 of the phase meter 26 and the other half is used to trigger the phase meter 26. The frequency and phase of this signal remains constant for the remainder of the measurement as it is used as the reference for phase to which all other frequencies are referenced.

The control unit 22 causes a second source SS2 to be stepped in multiples of F0 (say 100 MHz) from 1.F0 (100 MHz) to n.F0 (where n may be increased 1 at a time up to, say, 600 so that the bandwidth of the calibration is 60 GHz). At each such frequency (n.F0), the system determines the relative time correction term $\theta n$ (phase of $\epsilon 10$) by using the error correction model and derivations described above (effectively taking into account differences between the phase as measured by the phase meter and the phase as would be ascertained from the measurements made by the VNA). This is achieved by means of the VNA taking measurements via two measurement receivers of characteristics of the travelling waves as extracted by a directional coupler.

During this process, the phase jitter introduced by the phase meter 26 is significantly reduced by means of measuring the trigger signal with one of the receivers (R2) of the phase meter 26. Phase changes measured as between one measurement and another measurement, due to jitter, can be detected and accounted for (removed) by means of such measurements. (For example, this can be achieved by resetting the phase of the measured trigger signal to zero phase and applying the same time shift to the measurement channel: this would require the phase shift required to set the trigger signal to zero and multiplying it by the factor of n). The corrected (calibrated) error model parameters for each frequency nF0 are stored in memory 22 in the control unit 20. Such data can be subsequently uploaded into the VNA's own memory and/or supplied separately on computer-readable storage media, such as a USB memory device, or the like.

Calibration of the VNA in the manner described above, using the relatively simple set-up (without any complicated test equipment) as shown in FIG. 9, allows the measurement plane to be assumed to be at the receiver ports 18a, 18b of the VNA 6. It is then possible effectively to shift this information to another reference plane to take account of any test set/cables or the like used in the system when in normal use. (It will be appreciated that calibration can be effected in relation to a measurement plane at a different position, for example using a pre-calibrated test-set, which then facilitates shifting the phase calibration to a different reference plane, such as the receiver ports of the VNA.). Given that there is a receiver port of the VNA where the absolute phase can be correctly determined it is then possible during local calibration, when setting-up the VNA for use with a different test set for example, to connect one of the reference planes to that receiver port to transfer (in effect) the absolute phase information.

As no phase reference standard (PRS) or associated apparatus is required, either during calibration or subsequent use of the calibrated VNA, the approach of the first embodiment of the invention removes all bandwidth and frequency limitations associated with the other PRS-based approaches. Additionally, no receivers or signal sources are tied up to drive/measure the phase reference standard (see FIG. 1 for a typical architecture employing a phase reference standard). Thus, the full capabilities of the VNA, including multi-port capabilities and complex multi-tone signal generation, are maintained. There first embodiment also facilitates a much simpler measurement architecture, as well as increasing the flexibility of use of the VNA, once calibrated.

Furthermore, accuracy of the system of the first embodiment relies primarily upon the repeatability and stability of the signals generated by the signal source (SS1 to SS4) and LO of the VNA 6, which are generally accepted to be excellent for DDS-based sources.

Figure 10:
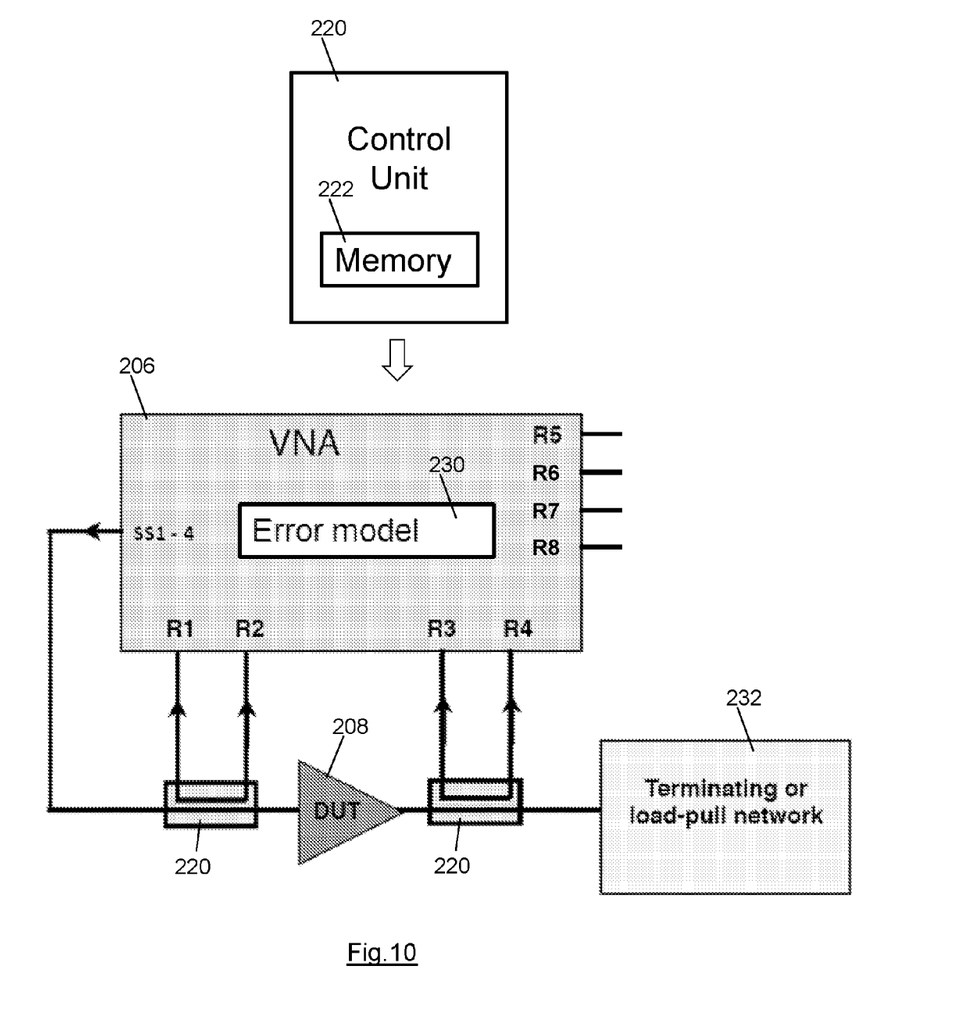
FIG. 10 shows a VNA being used to characterise the behaviour of a device under test, according to the second embodiment of the present invention.

A VNA 6 once calibrated, for example by employing the first embodiment, is able to be used in a method of analysing the large-signal behaviour and/or characteristics of a Device-under-Test (DUT). Such a method of analysing may be performed by means of the system of the second embodiment of the invention as shown in FIG. 10. FIG. 10 shows a calibrated VNA 206 having its own internal control unit and associated memory on which a corrected (calibrated) error model 230 is stored. A load pull network 232 (or a terminating load) is connected to one of the ports of the DUT 208 and another of the ports is connected to two or more (via a mixer, not shown, if required) signal sources (SS1-4) of the VNA 206 to provide a multi-tone test signal. The VNA measures at receiver ports R1-R4 the signals at the DUT's receiver ports by means of directional couplers 220. The phases of signal sources, being phase-locked relative to each other in the same way as calibrated for, in combination with the error model 230 allows the VNA effectively to extract absolute magnitude and phase of each frequency component measured at its receiver ports R1 to R4, and therefore also at the DUT's ports. It is therefore possible for the VNA to reconstruct the full signal waveforms at the ports of the DUT in the time domain. It will be noted that all four sources SS1-4 may be utilised and that four receivers (R1 to R4) are utilised with the fifth to eighth receivers (R5 to R8) all being spare for use for other purposes if so desired. It is therefore possible for the VNA to use all 8 receivers (R1 to R8) simultaneously and to perform 4-port measurements. It may, depending on the test set employed, be necessary to calibrate the measurement system by performing a further calibration to take account of the differences in the overall system architecture as between the initial calibration performed, say by means of the first embodiment, and the use of the measurement system to perform analysis of the DUT, say by means of the second embodiment. Such calibrations are well known in the art and may for example involve performing a Short, Open, Load, Through (SOLT) calibration test plus one additional measurement where the reference port is connected to the reference receiver.

Figure 11:
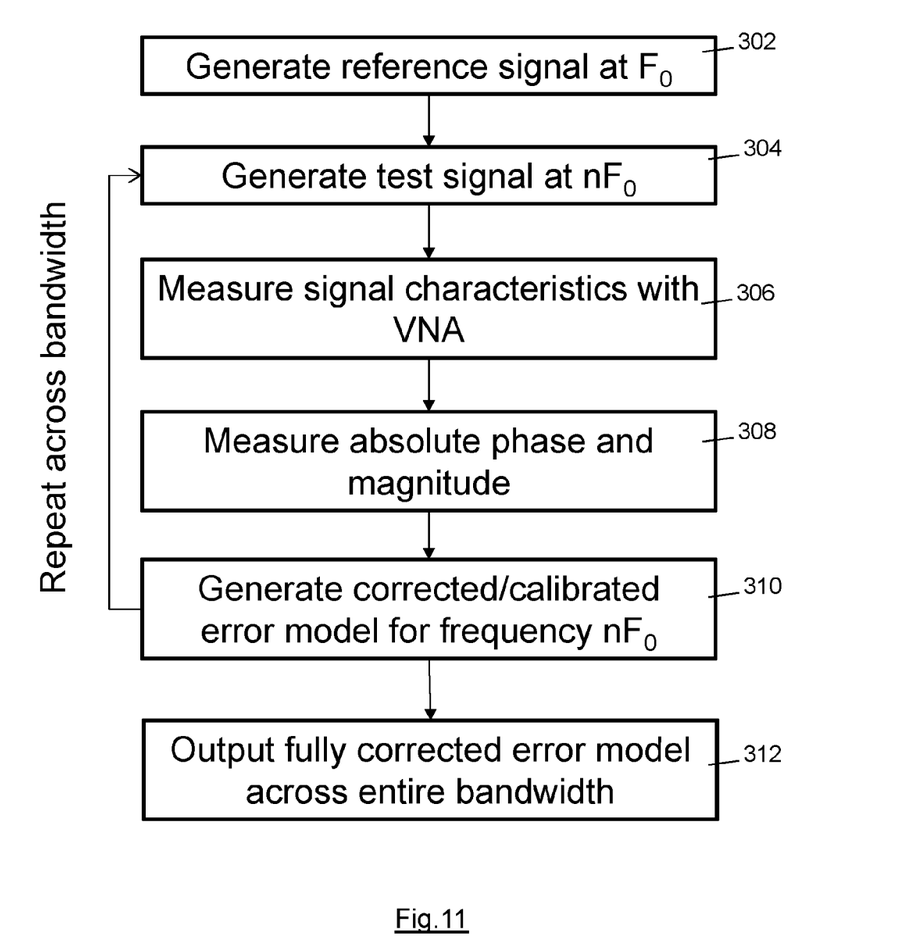
FIG. 11 shows the steps conducted in accordance with a third embodiment of the invention.

A flow-chart showing a method of calibration according to a third embodiment is shown in FIG. 11. It will be appreciated that the method of the third embodiment can, but need not necessarily, be carried out with the system of the first embodiment. The method is performed to calibrate a VNA over a bandwidth of 50 GHz with a resolution of 250 MHz. An oscilloscope and power meter are provided to perform the calibration under the control of a computer. The VNA is one which includes at least two phase-locked signal sources, for example DDS sources and at least two least two receiver ports. A test set comprising a cable and connector assembly is provided to make the connections between the VNA, oscilloscope and power meter. A signal measurement plane is thus defined at the receiver ports of the VNA. The cable and connector can be considered as non-dispersive, which means that they only impose a phase shift on the waveform, and do not distort the shape of the waveform in the time-domain. If a dispersive network were used this could be compensated by first measuring the s-parameters of the network across the bandwidth of measurement using a VNA. Any magnitude change or loss through the network (cable and connectors, for example) would need to be known, calculated, or otherwise taken into account, for the power calibration step to work. (In some set-ups it may be possible to connect the power meter directly to the relevant reference plane.)

As a first step 302, the VNA is used to generate a first (reference) signal at a frequency F0 (say 250 MHz). The next steps are performed for each frequency in the sequence from 250 MHz to 50 GHz in steps of 250 MHz. The next step 304 is using the VNA to generate, in addition to the first (reference) signal at a frequency F0, a second (test) signal at frequency nF0 (n increasing one at a time from 1 to 200, such that nF0 ranges from 250 MHz to 50 GHz in steps of 250 MHz). This signal, at frequency nF0, is measured via the VNA's receiver ports by means of extracting the travelling waves at the measurement plane by means of a suitably arranged coupler (for example, an internal coupler inside the VNA). Next (step 306) the VNA makes measurements of signals at its receiver ports. The absolute phase and magnitude of the signal at the measurement plane at frequency nF0 are measured (step 308) by the oscilloscope and power meter (in this embodiment the phase and magnitude are measured substantially simultaneously—switching from one to the other for each test frequency—noting that normally the steps of measuring absolute phase and magnitude of the signal would be conducted separately). The oscilloscope is triggered by the reference frequency F0 and the signal sources of the VNA are phase-locked so that both oscilloscope and VNA share the same reference from which absolute phase may be measured/ascertained. Error correction data relating the characteristics of the signal as measured by the VNA and the absolute phase and magnitude as measured with the oscilloscope and power meter is then calculated in step 310 and saved in electronic memory. Steps 304 to 310 are then repeated until the whole measurement bandwidth is covered. Lastly, as step 312, a fully calibrated error correction model is saved in memory.

Whilst the present invention has been described and illustrated with reference to particular embodiments, it will be appreciated by those of ordinary skill in the art that the invention lends itself to many different variations not specifically illustrated herein. By way of example only, certain possible variations will now be described.

The oscilloscope may have a calibrated power meter function, negating the need for the provision of a separate power meter unit.

It would be possible for a calibration to be performed without the use of an external test set. This could for example be performed by means of an oscilloscope with a remote measuring head. This can then be directly connected to one of the receivers of the VNA to do the calibration and would not require any connectors or receivers.

In a further embodiment of the invention, rather than using an oscilloscope to extract and correct for absolute phase during calibration, a fully characterised phase reference device (thus providing a characterised phase reference standard) could be used to ascertain and calibrate/correct for absolute phase of the system during initial calibration. Once the VNA is calibrated with the use of such an embodiment, the phase reference device may be disconnected and removed from the system. Absolute phase information can be ascertained with the use of the phase locked signals of the VNA and the fully calibrated error correction model. The phase reference device may itself need to be fully calibrated and characterised at all frequencies of interest, which may necessitate the use of an oscilloscope. Essentially, such an embodiment may be viewed as transferring absolute phase information from a phase meter (oscilloscope) to a reference device (phase reference standard) and then using that (the reference device) in the method of calibrating for absolute phase of the VNA system. Whilst such an embodiment might therefore be viewed as a more labour intensive and complicated means to achieve the benefits of the invention, such an embodiment has the advantage of not requiring an oscilloscope to be physically connected to the VNA. Suitable oscilloscopes may be expensive and/or difficult to transport to the site at which the VNA is located.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A method of calibrating a high frequency vector network analyzer, that does not inherently measure calibrated time domain waveforms, using at least two phase-locked signal sources a first signal source and a second signal source generating associated first and second frequencies, the network analyzer comprising at least two measurement receivers;
   the method of calibration also employs a phase meter for measuring a calibrated phase difference between the signal frequencies and comprises the following steps:
   a) outputting a reference signal at a first frequency from the first signal source;
   b) step through multiples of the first frequency using the second signal source, each of the multiple frequencies, being phase-locked with the reference signal;
   c) measuring, via the two measurement receivers and via the phase meter, the phase of the signal from the second signal source, relative to the reference signal and generating calibration data, relating the measurement receivers to the phase meter.

2. A method according to claim 1, wherein the method includes measuring the magnitude of the signal from the second signal source at multiples of the first frequency, and using additional equipment in the form of a power meter to generate calibration data relating the magnitude of the signal to the absolute power.

3. A method as in claim 1, wherein the step of measuring, with the phase meter, the phase of the signal from the second signal source relative to the reference signal, comprises measuring an absolute phase of the signal from the second signal source relative to a trigger signal, which is linked to the reference signal.

4. A method as in claim 1, wherein the step of measuring, with the phase meter, the phase of the signal from the second signal source relative to the reference signal, comprises ascertaining a phase of a secondary reference signal for the purposes of correcting jitter.

5. A method as in claim 1, wherein the phase meter is an oscilloscope.

6. A method as in claim 1, wherein the phase meter is phase reference standard equipment.

7. A method as in claim 1, wherein the step of using the second signal source to step through a plurality of multiples of the first test frequency includes stepping through over 10 frequencies separated by a constant frequency difference.

8. A method as in claim 1, wherein the first and second phase-locked signal sources are generated by the network analyzer and are in the form of independent direct digital synthesis (DDS) based signal generators, each capable of generating signals having a fundamental frequency of greater than 20 GHz.

9. A method of measuring a response of an electronic device to a high frequency input signal, the method comprising the steps of:
   providing an electronic device having a first port and a second port,
   providing the network analyzer comprising the at least first and second phase-locked signal sources, and the at least two measurement receivers,
   applying on at least one of the ports of the electronic device one or more high frequency signals, comprising a first component at the first frequency and a phase generated by the first signal source and a second component at the second frequency and a phase generated by the second signal source,
   c) measuring, at a plurality of different frequencies, and with the use of the at least two measurement receivers of the network analyzer, signals from the first and second ports of the electronic device, and ascertaining at least one of
   (a1) calibrated phase information from the signals measured by the network analyzer and
   (a2) a time domain representation relating to the signals measured by the network analyzer, by means of an error correction model, based on the calibration data generated by performing the method of claim 1.

10. A The method as in claim 9, wherein the network analyzer comprises at least four measurement receivers, and the step of measuring the signals from the first and second ports of the device includes using at least four measurement receivers simultaneously to measure, at the plurality of the different frequencies, signals from the first and second ports of the device.

* * * * *